United States Patent [19]
Eres et al.

[11] Patent Number: 5,540,783
[45] Date of Patent: Jul. 30, 1996

[54] APPARATUS FOR EXTERNALLY CONTROLLED CLOSED-LOOP FEEDBACK DIGITAL EPITAXY

[75] Inventors: Djula Eres; Jeffrey W. Sharp, both of Knoxville, Tenn.

[73] Assignee: Martin Marietta Energy Systems, Inc., Oak Ridge, Tenn.

[21] Appl. No.: 249,597

[22] Filed: May 26, 1994

Related U.S. Application Data

[62] Division of Ser. No. 68,027, May 28, 1993, Pat. No. 5,330,610.

[51] Int. Cl.$^6$ .................................................. C23C 16/00
[52] U.S. Cl. ........................... 118/725; 118/715; 118/729; 118/665; 118/668
[58] Field of Search ................................. 117/90, 91, 92, 117/93; 118/720, 715, 729, 725, 665, 668

[56] References Cited

U.S. PATENT DOCUMENTS

| | | | |
|---|---|---|---|
| 4,931,132 | 6/1990 | Aspnes et al. | 117/92 |
| 5,009,485 | 4/1991 | Hall | 427/8 |
| 5,164,040 | 11/1992 | Eres et al. | 117/92 |
| 5,242,530 | 9/1993 | Batey et al. | 117/90 |
| 5,250,148 | 10/1993 | Nishizawa et al. | 117/93 |

Primary Examiner—R. Bruce Breneman
Assistant Examiner—Ramamohan Rao Paladugu
Attorney, Agent, or Firm—Edward A. Pennington; J. Donald Griffin; Harold W. Adams

[57] ABSTRACT

A method and apparatus for digital epitaxy. The apparatus includes a pulsed gas delivery assembly that supplies gaseous material to a substrate to form an adsorption layer of the gaseous material on the substrate. Structure is provided for measuring the isothermal desorption spectrum of the growth surface to monitor the active sites which are available for adsorption. The vacuum chamber housing the substrate facilitates evacuation of the gaseous material from the area adjacent the substrate following exposure. In use, digital epitaxy is achieved by exposing a substrate to a pulse of gaseous material to form an adsorption layer of the material on the substrate. The active sites on the substrate are monitored during the formation of the adsorption layer to determine if all the active sites have been filled. Once the active sites have been filled on the growth surface of the substrate, the pulse of gaseous material is terminated. The unreacted portion of the gas pulse is evacuated by continuous pumping. Subsequently, a second pulse is applied when availability of active sites is determined by studying the isothermal desorption spectrum. These steps are repeated until a thin film of sufficient thickness is produced.

8 Claims, 4 Drawing Sheets

APPARATUS FOR EXTERNALLY CONTROLLED CLOSED-LOOP FEEDBACK DIGITAL EPITAXY

This invention was made with Government support under DE-AC05-85OR21400 awarded by the U.S. Department of Energy to Martin Marietta Energy Systems, Inc. and the Government has certain rights in this invention.

This is a divisional of application Ser. No. 08/068,027 filed May 28, 1993 now U.S. Pat. No. 5,330,610.

FIELD OF THE INVENTION

The present invention relates to digital epitaxy of thin films by deposition from the gaseous phase, and more particularly, to a method and apparatus for submonolayer controlled, digital growth of epitaxial thin films of covalently bonded materials.

BACKGROUND OF THE INVENTION

Thin filmed materials are often utilized in semiconductors, ceramics, metals and superconductors. For example, thin layer materials are utilized in the production of highly complex silicon integrated circuits. A number of methods are known for producing thin films including vacuum evaporation, molecular beam epitaxy, and atomic layer epitaxy (ALE), etc. Additionally, such materials are useful in the development of electronic devices based upon bandgap engineering.

Particularly, atomic layer epitaxy has been used for growth of compound semiconductors and other thin film structures. C. H. L. Goodman and M. V. Pessa, *Atomic Layer Epitaxy*, Journal of Applied Physics 60(3), Aug. 1, 1986, R65-R81; M. Ozeiki et al., *New Approach to the Atomic Layer Epitaxy of GaAS Using Fast Gas stream*, Applied Physics Letters, Vol. 53, Number 16, Oct. 17, 1988, pp.1509–1511; U.S. Pat. No. 4,058,430 to Suntola et al. However, such growth has only been achieved with ionically bonded compounds. The growth of other than ionically bonded compounds by ALE has not been successful. Specifically, layer-by-layer growth of materials from non-elemental sources (gaseous chemical compounds) can not be achieved using ALE.

ALE was developed for the growth of ionically bonded materials, such as compound semiconductors. In its present form, ALE has only successfully been used for compound semiconductor growth. ALE achieves monolayer-by-monolayer growth by chemisorption of one gas phase component onto a saturated surface having a monolayer coverage of the other component. The reaction proceeds until the surface is saturated with the one gas phase component. At this point the saturation cover is believed to be only a monolayer thick because once the strong chemisorption bonds are saturated, physisorption is too weak to build up further layers. The role of the two components is then exchanged and the reaction is repeated. A film of finite thickness is built up by alternating the exposure of the surface to the constituent components.

ALE growth is conducted at growth conditions collectively known as the "ALE processing window", which is arrived at by systematic empirical study. Generally, the only analytical feedback on layer control in ALE is provided by external, remote analysis of the grown films. In other words, the article must be removed from the process chamber and place in a separate and distinct testing device. The exposure times of the growth surface are then readjusted until this trial and error procedure produces a material that consists of alternating monolayers of constituent elements. The procedure for establishing the "ALE processing window" for compound semiconductor growth cannot be directly extended to metals or semiconductors with covalent bonding. In order to produce layer-by-layer growth materials from other than ionically bonded materials from gaseous molecular sources, a different controlling mechanism must be utilized.

Another disadvantage of existing ALE technology is that ALE is limited to binary systems that can simultaneously exhibit strong chemisorption and weak physisorption at temperatures appropriate for thin film growth. This constraint has limited the application of ALE to ionically bonded compound semiconductors.

Further, the static nature of ALE is determinative of its capabilities. Therefore, only a fully saturated surface satisfies the requirements for controlled growth.

A further disadvantage of existing ALE technology is that film growth in ALE occurs per cycle of exposure. Frequently one cycle of exposure is referred to as a pulse. One cycle of exposure produces a complete atomic layer of material.

Pulsed supersonic jets have been used to provide rapid deposition of a thin film upon heated substrates for the preparation of semiconductors and similar electronic devices. While the pulsed supersonic jet process grows a large amount of deposits in a short time, there is difficulty in controlling the process without feedback data.

As demonstrated by the patents to Hall (U.S. Pat. No. 5,009,485), Aspnes et al. (U.S. Pat. Nos. 4,931,132 and 4,332,833), Siegmund et al. (U.S. Pat. No. 4,878,755), Keller et al. (U.S. Pat. No. 4,846,920), Hartley (U.S. Pat. No. 4,770,895), Tien (U.S. Pat. No. 4,713,140), Strand et al. (U.S. Pat. No. 4,676,646), and Cole (U.S. Pat. No. 4,582,431), the use of optical methods for monitoring the development of materials is known in the art.

The disadvantages and limitations of the prior art techniques discussed above indicate the need for an efficient, versatile, and controllable method and apparatus for layer-by-layer production of thin films. The subject invention provides such a method and apparatus.

SUMMARY OF THE INVENTION

It is an object of the invention to provide a method and apparatus for deposition of thin film materials in discrete submonolayer increments including metals, insulators, superconductors, semiconductors and alloys thereof.

It is another object of the invention to provide a method and apparatus for the deposition of thin films of covalently bonded materials and semiconductor films selected from elements in Group IV of the Periodic Table.

It is a further object of the invention to provide a method and apparatus having a closed loop feedback system.

It is also another object of the invention to provide a method and apparatus wherein the closed loop feedback system is achieved by monitoring the isothermal desorption spectrum of the growth surface.

It is another object of the invention to provide a method for real-time in-situ monitoring of the growth of thin films.

It is also a further object of the invention to provide a method and apparatus having thickness control at the monolayer level stemming from the digital nature of the process.

These and other objects of the invention are achieved by the instant method and apparatus for digital epitaxy. The apparatus includes a pulsed gas delivery assembly that supplies gaseous material to a substrate to form an adsorption layer of the gaseous material on the substrate. Means are also provided for measuring the isothermal desorption spectrum of the growth surface to monitor the active sites which are available for adsorption. The vacuum chamber housing the substrate facilitates evacuation of the gaseous material from the area adjacent the substrate following exposure.

In use, digital epitaxy is achieved by exposing a substrate to a pulse of gaseous material to form an adsorption layer of the material on the substrate. The active sites on the substrate are monitored during the formation of the adsorption layer to determine if all the active sites have been filled.

Once the active sites have been filled on the growth surface of the substrate, the pulse of gaseous material is terminated. The unreacted portion of the gas pulse is evacuated by continuous pumping. Subsequently, a second pulse is applied when availability of active sites is determined by studying the isothermal desorption spectrum. These steps are repeated until a thin film of sufficient thickness is produced.

By providing a closed loop system where thin film growth can be monitored and the growth parameters adjusted in real time, and by providing a system whereby thin films of covalently bonded materials can be produced, the problems associated with the prior art layer-by-layer deposition methods (e.g., ALE) are overcome.

Other objects, advantages and salient features of the invention will become apparent from the following detailed description, which, taken in conjunction with the annexed drawings, discloses preferred embodiments of the invention.

DETAILED DESCRIPTION OF THE INVENTION

The instant method and apparatus relates to the deposition of thin film materials including metals in discrete submonolayer increments, insulators, superconductors, semiconductors and alloys thereof. The method and apparatus are especially useful for the deposition of thin films of covalently bonded materials and semiconductor films selected from elements of Group IV of the Periodic Table. The high degree of thickness control provided by the subject method and apparatus is useful in the growth of artificially structured materials. Additionally, the subject invention could be useful in the development of electronic devices based upon bandgap engineering.

Prior to discussing the specifics of the subject method and apparatus it is important to note that molecular sources used in thin film growth often generate products other than just the thin film material. These side products remain on the growth surface and hinder thin film growth by occupying active sites necessary for the formation of the next layer of a thin film. For example, chemisorption of digermane used in germanium growth occurs by adsorption of hydridic digermane fragments. The hydrogen is a side product that prevents further chemisorption of digermane. Consequently, in order for a surface chemical reaction to be viable for thin film growth, desorption of the side products must be efficiently controlled, while providing for incorporation of the desired species into the surface layer to produce a thin film. In the subject invention, desorption and adsorption on the growth Surface are monitored in-situ to assess the active site density on the growth surface.

As to the following discussion, the term "chemisorption" refers to adsorption of digermane molecules on a substrate surface in the form of hydridic germanium fragments. The term "adsorption layer" refers to the hydridic fragment layer. The term "growth surface" refers to any surface of the substrate, thin film or adsorption layer formed on the substrate having surface sights (blocked or unblocked) for the formation of a thin film layer.

In studying the subject invention, it should be understood that the thin film growth process resulting from the adsorption layer formation is correlated with the isothermal desorption spectrum ('ITDS') of the growth surface. The ITDS provides real time in-situ information about the processes occurring on the growth surface. Furthermore, the concentration of active sites produced by desorption of surface reaction products are derived from the ITDS. As a result, the ITDS is utilized in the subject invention to control thin film growth in a digital or discrete submonolayer increments, i.e., digital epitaxy.

The instant specification demonstrates the use of the ITDS for epitaxial thin film growth of germanium from digermane source molecules. When a digermane pulse hits the heated substrate surface, some of the molecules stick to it by occupying active surface sites to form an adsorption layer. The adsorption layer formed by the digermane has side products, hydrogen, that must be removed by way of desorption before another layer may be applied to the substrate. Monitoring of the adsorption and desorption provides a closed loop control system for the subject invention. However, the control mechanism described for germanium growth is quite general and is applicable for thin film growth of any other materials within the spirit of the subject invention.

Figure 1:
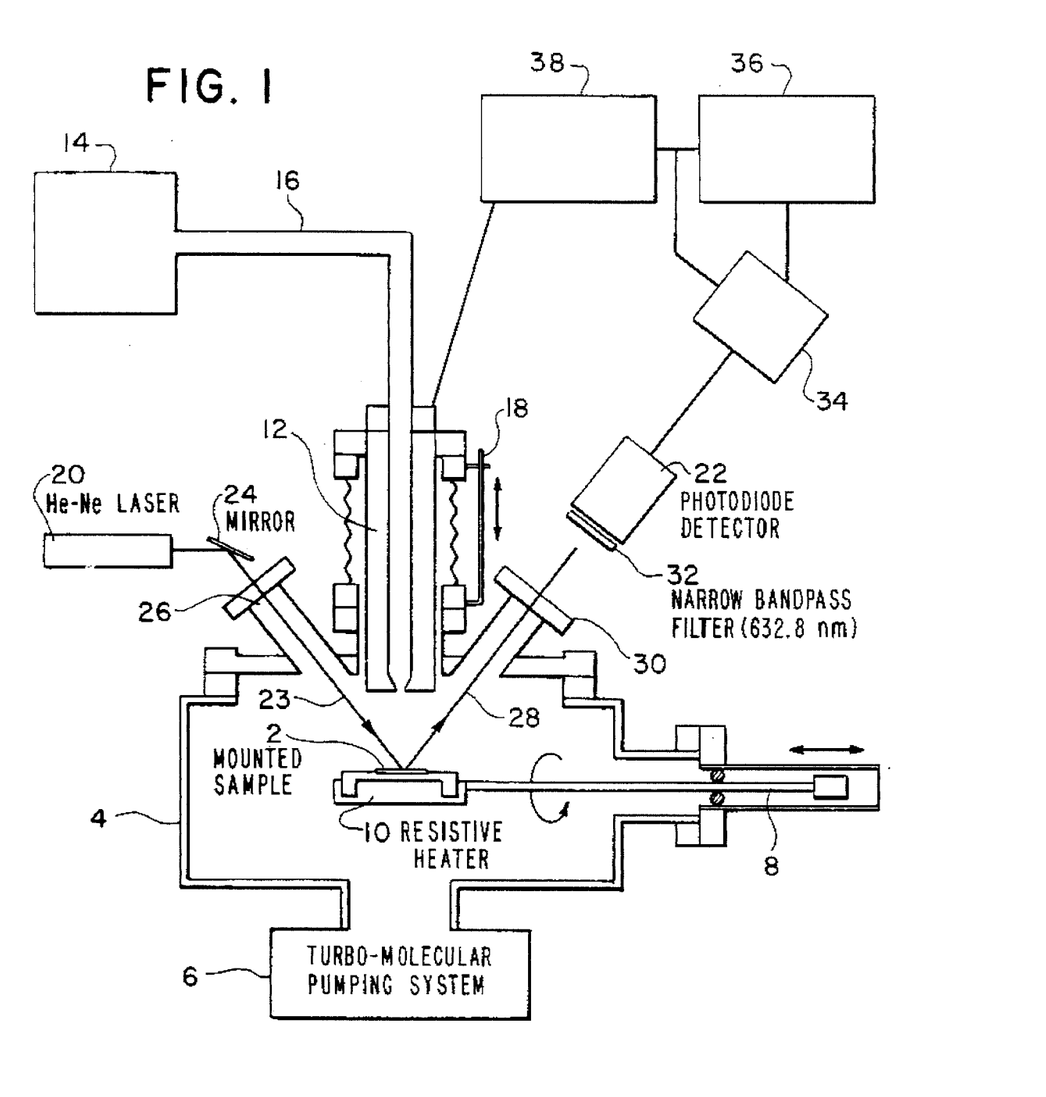
FIG. 1 is a schematic of the apparatus for performing the subject method.

The preferred embodiment of the apparatus for performing the instant invention is shown in FIG. 1. The substrate 2 (e.g., Si(100)) is positioned in a 23 liter stainless steel vacuum chamber 4 that is continuously pumped by a high throughput, high pumping speed, vacuum pump 6 (e.g., a 170 liter/sec turbo-molecular pump, backed by a two-stage mechanical pump). The substrate 2 is attached by quartz clips (not shown) to a substrate manipulator 8, that is used for adjusting the substrate 2 position with respect to a pulsed molecular beam valve 12 and a laser beam 23. Additionally, the substrate 2 is heated by a pyrolytic graphite filament heater 10 encapsulated in pyrolytic-boron-nitride and the temperature of the substrate is monitored by an infrared radiation thermometer (not shown), although other heating system may be used.

The pressure in the chamber prior to film growth is typically in the low $10^{-7}$ Torr region. Film growth is initiated by short gas pulses (e.g., pulses of digermane) directed at the surface of a heated substrate 2. The gas pulses are delivered to the substrate by a fast acting, pulsed molecular beam valve 12 which is connected to a source gas reservoir 14 by a gas handling manifold 16 having safety related systems. Additionally, the pulsed molecular beam valve 12 is attached to a linear translator 18 used to change the distance between the pulsed valve and the substrate. The pulsed molecular beam valve 12 is preferably a solenoid operated valve constructed in a conventional manner to perform within the spirit of the subject invention.

The pulse duration, which is adjustable electronically, is typically a few milliseconds. The pulsed molecular beam valve 12 is shielded from the heated substrate 2 by a water cooled housing (not shown). The peak pressure in the chamber 4 during the pulse on-time never exceeds $10^{-3}$ Torr. The time-averaged pressure during growth depends on the pulse repetition rate: typically in the mid $10^{-4}$ Torr region at 3 Hz.

As previously discussed, a preferred embodiment of the invention utilizes digermane for germanium growth. As such, short gas pulses of digermane are produced by the pulsed molecular beam valve 12. The pulses of digermane are directed at the substrate 2 and the layer growth occurs by adsorption of the hydridic digermane fragments at the active sights of the substrate. Hydrogen is a side product that blocks active sights on the adsorption layer of digermane and prevents further chemisorption of digermane.

For example, a 5% mixture of digermane in helium was used for digital epitaxial germanium growth on Si(100). An expansion from the source gas reservoir, with stagnation pressure in the range of 20–50 psia, through a nozzle with an orifice diameter of 0.150 mm produces a supersonic gas jet. However, digital epitaxy is not limited to using only supersonic jets. Subsonic jets of pure source gases are also capable of producing saturation surface coverage from short duration pulses.

In order for a surface chemical reaction to be viable for thin film growth, desorption of the side products must be effectively and efficiently controlled, while providing for incorporation of the desired species into the surface layer to produce a thin film.

The formation and evolution of the adsorption layer following the gas pulse is monitored by studying the isothermal desorption spectrum of the growth surface. The ITDS is measured by time-resolved reflectometry. In the preferred embodiment, a high stability (amplitude noise 0.02% rms) helium-neon (632.8 nm) laser 20 is reflected from the surface of the substrate and detected by a Si photodiode 22. Specifically, the laser 20 directs a beam of light 23 at a mirror 24 which reflects the light through a first window 26 in the chamber 4 and toward the substrate 2. The light beam 23 is reflected by the substrate 2 to produce a resultant light signal 28 which exits the chamber 4 through second window 30. The signal 28 then passes through a narrow bandpass filter 32 and is detected by the photodiode 22.

The signal is then digitized by an analog to digital converter 34 ('ADC') and stored in a microcomputer 36. The timing between opening of the pulsed valve and the onset of data collection is adjusted by an electronic delay generator 38.

The adsorption layer formation and evolution manifests itself in modulation of the intensity of the specularly reflected light from the laser. After detecting the signal 28 from the growth Surface by the photodiode 22, it is collected, displayed, and stored by a microcomputer 36. An oscilloscope (not shown) can also be used for displaying the transient signal.

As stated above, the formation of the adsorption layer is monitored in real time by time resolved reflectometry. The reflectivity change corresponding to a digermane pulse is referred to as the transient reflectivity signal. The transient reflectivity signal shown in the high resolution ITDS of FIG. 2 consists of a steeply falling edge that corresponds to the adsorption layer formation. Investigations show that digermane chemisorption is rapid and independent of substrate temperature. The steep fall illustrates rapid chemisorption. The recovery of the transient reflectivity signal past the maximum amplitude represents the isothermal desorption spectrum. The amplitude of the ITDS is directly proportional to the density of blocked sites (see FIGS. 2 and 3). The amplitude of the ITDS is at its maximum when all available active sites are occupied. The time dependent recovery of the ITDS amplitude is associated with regeneration of the active sites.

Since digermane chemisorption is rapid and independent of the substrate temperature, very short digermane pulses (2–3 milliseconds) are used to saturate all the active surface sites. Once all the active sites are occupied, no additional digermane molecules can bond to the substrate by chemisorption. The chamber is continuously pumped to evacuate the unreacted portion of the digermane pulse from the vacuum chamber to produce exactly a single uniform monolayer coverage.

Before net film growth can occur by the application of a second digermane pulse, the active sites must be regenerated by eliminating only the side products that occupy the active sites, in this case hydrogen. In the instant invention, the active surface sites are regenerated by molecular hydrogen desorption induced by substrate heating. That is, the substrate temperature is fixed such that the evacuation of the unreacted digermane is much faster than hydrogen desorption. As a result, the germanium atoms from digermane remain on the surface of the substrate becoming part of the film being created and the unreacted digermane is pumped away from the substrate, while the hydrogen is removed from the digermane by desorption. Ideally, this process adds one monolayer of germanium to the film.

Since no digermane is present in the chamber during the time between two successive pulses (pulse period), hydrogen desorption fully regenerates the active layer in the time between the two successive pulses. After the active surface is regenerated, a new digermane pulse is used to initiated growth of the next monolayer of film.

As previously discussed, time-resolved reflectometry is used to monitor the residual hydrogen coverage. The use of reflectometry is based on changes in the growth surface electronic structure in response to adsorption of hydridic digermane fragments. A detailed description of the principles of optical reflectometry and its application is given in a paper by J. D. E. Mcintyre and D. E. Aspnes, *Surf. Sci.* 24, 417 (1971). In the present technique an ultra stable HeNe laser is reflected from the surface of the growing film. Chemisorption of digermane produces a decrease in the intensity of the specularly reflected light that is linearly proportional to the surface coverage. Regeneration of the active sites by hydrogen desorption recovers the original reflectivity signal. Therefore, the transient reflectivity signal can be used to monitor the kinetics of the adsorption layer formation and the hydrogen desorption.

Figure 2A:
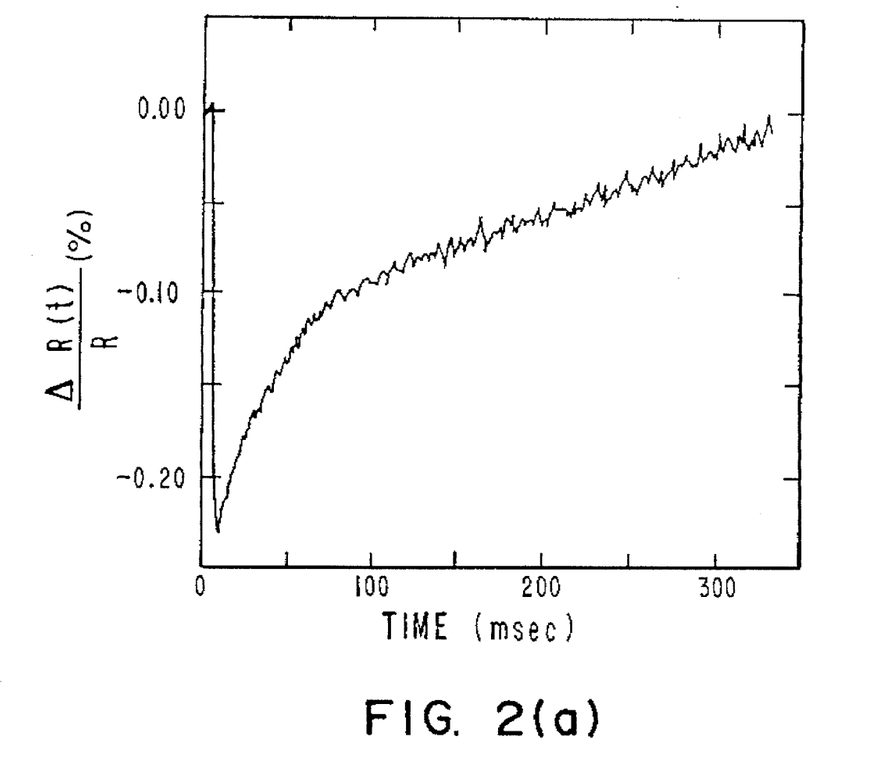
FIG. 2 shows a high resolution isothermal desorption spectrum and, the inset, shows reflectivity change v. time for adsorption layer formation.
Figure 2B:
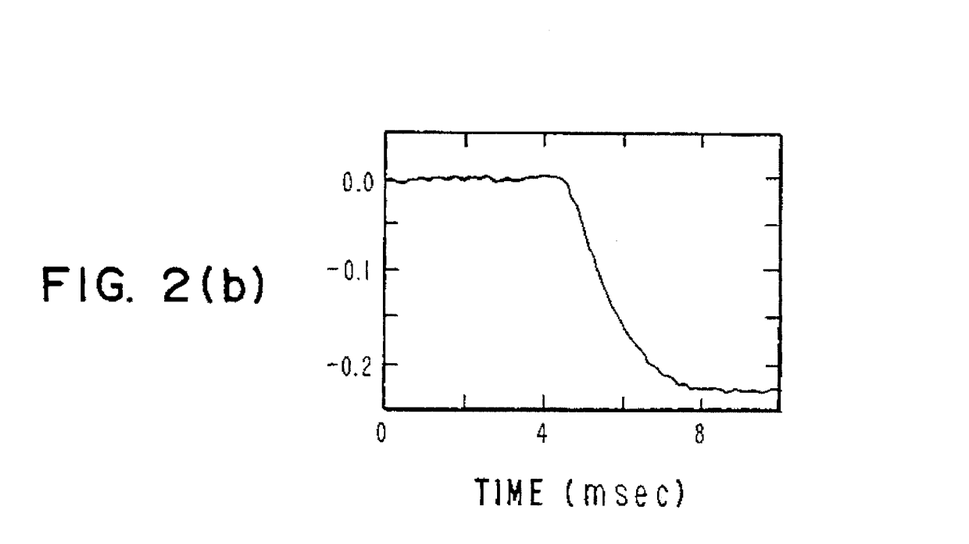

More specifically, thin film growth correlates with the amplitude of the transient reflectivity signal in the following manner. At the maximum amplitude the density of the active film growth sites is lowest because all the sites are occupied by hydrogen that prevents chemisorption of digermane. Consequently, the maximum of the ITDS amplitude corresponds to zero film growth. Recovery of the transient reflectivity signal indicates that active sites are being regenerated and that chemisorption of new digermane molecules can occur. FIG. 2 shows a high resolution ITDS of digermane on Si(100). The kinetic order of the desorption process determines the behavior of the ITDS. The simplest desorption process is described by a single exponential first order reaction. The active sites for germanium growth are regenerated by such a first order hydrogen desorption process. The hydrogen desorption process was found to be strongly temperature dependent with an activation energy of E=1.7 eV and a frequency factor of $1.6 \times 10^{13}$ sec$^{-1}$.

In summary, the instant invention utilizes the hydrogen desorption process, which is relatively slow at low and intermediate substrate temperatures (much slower than digermane chemisorption), in combination with pulsed digermane delivery as an externally controlled self-limiting film growth mechanism. Hydrogen coverage of the growth surface produced by chemisorption of hydridic digermane fragments terminates further chemisorption until the active sites are regenerated by hydrogen desorption. The active sites are regenerated after the digermane has been evacuated from the vacuum chamber to prevent uncontrollable chemisorption from the background. The slow hydrogen desorption process at low substrate temperatures prevents successive chemisorption of multiple digermane molecules at a single active site and allows evacuation of all the unreacted digermane following the digermane pulse. As a result, without desorption of the hydrogen side product, the chemisorption process of digermane is limited to a monolayer coverage. Consequently, only those active sights that are regenerated during the delay time between pulses (i.e., pulse period) can chemisorb new source gas molecules from the next pulse.

The corresponding hydrogen coverage oscillations on a surface are related to germanium film growth rates by the following equation:

$$G=(a_0+4)(1+t)\theta_0[1-\exp(-k_d t)].$$

Where G (nm/s) represents the growth rate, $a_0$ is the lattice constant of germanium, and t(s) is the pulse period. $\theta_0$ is the hydrogen surface coverage at the end of the pulse. $\theta_0$ has a fixed value between 0 and 1 depending on the experimental conditions. $k_d$(s$^{-1}$) is the hydrogen desorption rate constant. The growth rate $G=(a_0/4)\theta_0 k_d$ for continuous digermane supply is obtained as a limiting case of the above equation for infinitely small (t→0) pulse periods.

For a particular substrate the amplitude of the hydrogen coverage oscillations depends on the substrate temperature, the source gas pulse period, and the pump-out time constant. The interference caused by chemisorption of background digermane can be reduced or eliminated by increasing the pumping speed of the apparatus. For a particular material, the amplitude of the oscillations depends on the crystallographic orientation of the substrate. Other experimental parameters may also influence the amplitude of the oscillations. In addition to Ge(100), hydrogen coverage oscillations are also observed on GaAs(100), Si(111), and Si(100). The oscillations are produced on a Si(100) surface at 743K. substrate temperature from a burst of digermane pulses with a pulse period of 0.333 s. Stopping the pulsation results in depletion of the surface.

Regeneration of the active surface sites is monitored and after all the active sites are regenerated, a new digermane pulse is used to initiated the growth of the next layer. Alternatively, partially dehydrogenated surface layers can be utilized to control the growth process at the submonolayer level.

Figure 3:
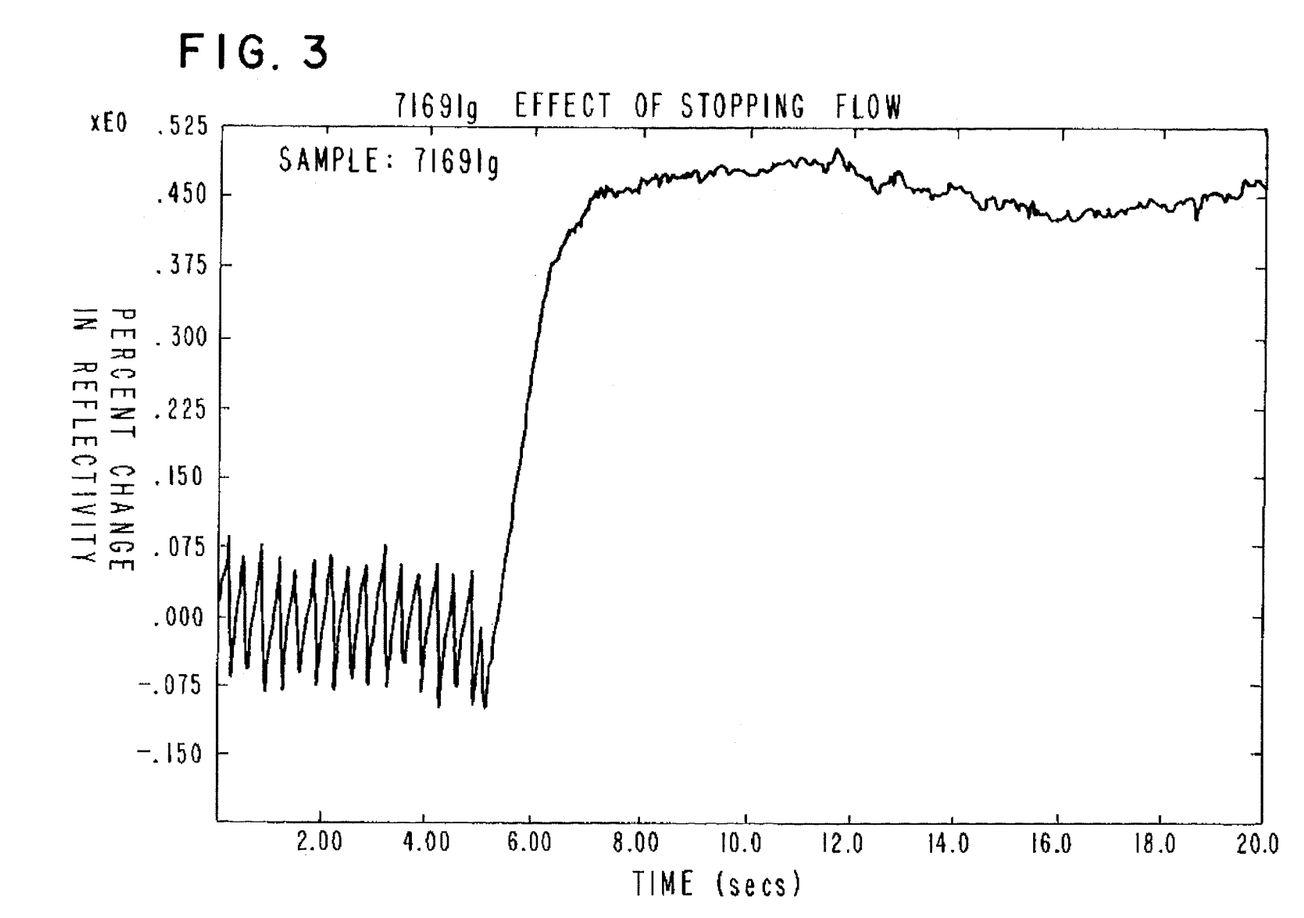
FIG. 3 shows a low resolution isothermal desorption spectrum produced in accordance with the subject invention.

The closed-loop feedback mechanism of the instant invention is achieved by monitoring the ITDS and, consequently, the surface coverage of the substrate via the transient reflectivity signal. In-situ real time monitoring of the ITDS generates data from which corrections to the substrate temperature, pulse intensity, and delay time between pulses can be made during the growth process to maintain the film growth process within the desired parameter space. The film thickness deposited per pulse depends on the number of active surface sites that are available when the source gas pulse arrives. FIG. 3 illustrates the importance of the real time feedback mechanism for obtaining the correct timing between successive source gas pulses. The density of active sites regenerated at a fixed substrate temperature depends on the pulse period. For short pulse periods the low density of regenerated active sites (a small change in the transient amplitudes) results in poor control over the film growth process. Optimal conditions for monolayer control of the film growth process are achieved by adjusting the pulse period and the substrate temperature such that digermane chemisorption is terminated at monolayer coverage and the sites blocked by hydrogen coverage are fully regenerated by desorption before arrival of a new digermane pulse.

The subject invention is contemplated for use for the growth of epitaxial thin films consisting of 1) elemental material, 2) superlattices consisting of alternating layers of two or more different materials and 3) ultrathin binary alloy layers.

Epitaxial growth of single component materials is demonstrated for germanium growth on Si(100) substrates from a multitude of discrete digermane pulses. FIG. 3 illustrates a typical oscillatory response obtained from monitoring the growth process. The oscillations correspond to hydrogen coverage changes from discrete digermane pulses that produce a per pulse increase in the net film thickness. The net film thickness can be obtained by simply counting the coverage oscillations.

Growth of superlattices consisting of alternating layers of two or more materials is a simple extension to using multiple sources. For example, Si/Ge superlattices can be grown by using alternating single pulses or pulse sequences (depending on the desired film thickness) of disilane and digermane.

Ultrathin binary alloys are grown by periodically introducing a single pulse or burst of pulses of one component at high intensity into a continuous low pressure growth environment of the component. For example, a roughly 90% Ge containing thin alloy layer can be grown by introducing a digermane pulse with a flux that is 9 times higher than the flux from a low pressure steady-state background growth of silicon from disilane.

Digital epitaxy, as disclosed by the subject invention, can be used for the deposition of any material that occurs by adsorption layer formation and thermal regeneration of active adsorption sites. The surface coverage during film growth is governed by intrinsic factors and characteristics of the material involved. Additionally, surface coverage during film growth is governed by extrinsic factors such as substrate temperature, intensity of source gas pulse, and beam modulation frequency.

The controlling mechanism utilized in digital epitaxy is based on the combined effect of slow hydrogen desorption and rapid digermane chemisorption. The temperature independent rapid chemisorption allows saturation of the active sites from a short duration digermane pulse. The digermane pulses are only 2 to 3 milliseconds long compared to seconds or minutes of exposure in ALE. The substrate temperature is maintained such that the temperature dependent hydrogen desorption process is much slower than the chamber pump-out time (i.e., the evacuation time for the gas pulse). This requirement limits chemisorption of digermane to one molecule per site and allows evacuation of the unreacted portion of the gas pulse. In-situ real-time monitoring of the growth surface is used to determine the growth parameters that satisfy these requirements. Many other surface reactions exhibit similar behavior, that is, a rapid chemisorption step followed by a temperature dependent desorption of products, and could be incorporated within the spirit of the subject invention.

The rapid initial chemisorption step can be terminated at a monolayer thickness by adjusting the substrate temperature such that the regeneration of the active sites is negligible during the pump-out time of the unreacted portion of the gas pulse. Thin film growth occurs by regenerating the active sites in the absence of the source gas and subsequent chemisorption of digermane molecules provided by a new source gas pulse. Compared to ALE, the subject invention requires only one source gas to realize thin film growth. Typical thickness per pulse values of 0.4 monolayers were observe for germanium growth on Si(100). If the delay time between successive pulses is too short, most of the source gas will scatter off without contributing to film growth. The optimum pulse repetition rate is determined by the characteristics of the surface reaction, and derived from the ITDS. For example, test results show that where the repetition rate is 3 Hz, the average growth per pulse was 0.25 monolayers, and, consequently, a growth rate of 0.75 monolayers per second was obtained.

The closed-loop feedback system is achieved by monitoring the ITDS. The ITDS is used for determining the availability of active sites on the growth surface. The ITDS can be used to elucidate the type of surface reaction (kinetic reaction order) operating at particular growth conditions. The information from the ITDS is used to generate the feedback loop. For example, digermane is provided only when the ITDS shows that active sites are available. The ITDS can also be used for in-situ tailoring of the composition of binary alloys of silicon and germanium. For example, the growth of 50% silicon containing Si/Ge alloys is achieved by timing the arrival of the silicon source gas at the stage when half of the surface sites are available for chemisorption of the silicon source (the other half was covered with germanium fragments from a preceding digermane pulse). Adjustments to surface temperature, source gas pulse intensity, and pulse timing can be made simultaneously in order to maintain the self-limiting growth mode.

Further, ultrathin films of uniform thickness can be achieved by the subject method and apparatus. The controlling mechanism provides the means for precise external thickness control. The growth-per-pulse can be determined by monitoring the amplitude of the signal produced by the adsorption layer resulting from each source gas pulse.

Additionally, improved efficiency of growth from superthermal source molecules is achieved by the subject invention. As stated above, a mixture of 5% digermane and helium has been tested for germanium growth in accordance with the subject invention. The digermane molecules expanded from a high pressure nozzle acquire superthermal energies. These energetic molecules improve the conversion efficiency of the source gas into thin film material by increasing the reaction efficiency of the incident source molecules at the growth surface. However, the invention is not limited to use with supersonic expansions. Pure source gases as well as their low concentration mixtures with inert carrier gases can be used in digital epitaxy.

As stated previously, the invention is not limited to germanium thin film growth, nor to covalent semiconductor thin film growth. The scientific principles involved in determining and maintaining a surface coverage of adsorbates are quite general. Consequently, this method and apparatus can be used for thin film growth of other materials such as metals, insulators, superconductors, semiconductors, and for alloys of these materials. The technique is most suitable for growth of artificial structures consisting of multi-layers of various materials, but it can be used for growth of thicker materials of high surface uniformity. The high degree of thickness control can be utilized for growth of artificially structured materials consisting of thin layers of semiconductors, ceramics, metals, and superconductors. Since this is the only technique available to date for closed-loop feedback controlled layer-by-layer growth of covalently bonded Group IV semiconductors it is of major significance in the implementation of three dimensional integration for production of silicon integrated circuits of high complexity.

EXAMPLE

The following is exemplary of the method and equipment which may be used for the formation of an adsorption layer within the spirit of the instant invention.

As to the pulsed gas, it is released through an orifice at pressures sufficiently high that the flow in the vicinity of the orifice is governed by hydrodynamic equations and results in the gas obtaining supersonic velocities. Quantitively, the criterion for obtaining supersonic flow is that the mean free path (mfp) for molecule-molecule collisions must be much less than the dimension that characterizes the orifice. For a circular opening this dimension is the diameter, d. The supersonic jet flow used in accordance with the subject invention, with mfp<<d, is most easily viewed as one of the three possible flow regimes for an expansion through a nozzle, the other two being effusive flow (mfp>>d) and intermediate flow (mfp≈d).

The pulsed molecular beam valve is solenoid operated. More specifically, a fast rise-time power supply (not shown) drives a current (approximately 15 amps) through the coil in the valve to break the seal between the plunger and the O-ring. This controls the flow of gas from the reservoir through the orifice. The thickness of the orifice should be less than the diameter of the orifice in order to suppress both the formation of clusters and the concentration of gas along the expansion axis.

The gases are binary mixtures of digermane in an inert carrier gas, while the fluid dynamic description of the expansion utilizes a single velocity that depends on the mean molecular mass. In the ideal high-density expansion both gases will obtain the same velocity. In practice, deviations from velocity equalization are caused by the inefficiency of kinetic energy exchange between molecules of unlike mass and can be analyzed in terms of a parameter called the velocity slip.

For an expansion at absolute temperature T and with negligible slippage, a component of mass M in a mixture with mole-fraction weighted average mass <m> attains a mean kinetic energy of $2.5 k_B T(M/<m>)$. The data available on this entrainment phenomenon suggests that our expansion conditions meet the low slippage requirement. If this is actually the case, then mixtures of 5% $Ge_2H_6$/He and 5% $Ge_2H_6$/Ar provide the digermane molecules with kinetic energies of ≈0.8 eV and ≈0.2 eV, respectively, assuming $k_B T$=0.026 eV. These energies are approximately 8 to 30 times greater than a typical thermal energy. Reactions between small, saturated molecules and clean metal surfaces are frequently found to be greatly accelerated by such superthermal energies. In sharp contrast, test results indicate little if any difference in semiconductor film growth efficiencies for the two mixtures just mentioned.

In this example, the pulsed molecular beam valve rapidly deposits an adlayer on the growth (substrate or film) surface, allowing us to monitor its subsequent evolution. The angular distribution of the growth molecules (i.e., the flux of digermane as a function of the angle $\alpha$) is therefore not essential information. It is useful, though, to make estimates of the flux based on the most pertinent available data and theory. As a matter of convenience, supersonic jet flux distributions often are characterized by a $(\cos\alpha)^m$ distribution. Drawing on published data, we expect the angular distribution of digermane generated by our expansion conditions to have $3<m<6$. Applying this distribution, the instantaneous (time-averaged) intensity, I, is calculated from the instantaneous (time-averaged) flow rate, F, as $$I(R,\alpha)=F(m+1)(\cos\alpha)^m/(2\pi R^2).$$

$I(R,\alpha)$ is the fluence, i.e., the number of molecules per unit area per unit time crossing a sphere of radius R centered on the nozzle. For an element of area at a distance R from the orifice and located on a plane that is perpendicular to the expansion axis and a distance D from the orifice, this can be rewritten. Two of the additional three powers of the cosine come from $D=R\cos\alpha$; the third arises from the scalar product of the molecular velocity vector with the surface normal.

The substrates are $\approx 2.4\times 2.4$ cm$^2$ pieces cut from single-Crystal wafers of either (100) or (111) orientation. After being degreased with solvents the Si substrates are etched according to the RCA recipe[14] (15 minutes each in 5:1:1 $H_2O/H_2O_2/NH_4OH$ and 6:1:1 $H_2O/H_2O_2/HCl$ solutions, both at 80° C.) and dipped in dilute HF for 45 seconds. After a final $H_2O$ rinse the substrates are blown dry with $N_2$, mounted and placed in the growth chamber. The germanium wafers used receive the same treatment minus the RCA clean. Studies with Si indicate that, used in conjunction, the RCA clean and HF dip remove nearly all of the surface oxide and carbon. In addition, infrared spectroscopy shows that the resulting surface is primarily terminated by a passivating hydride.

Further preparation carried out in-situ just prior to film growth varies with the type of substrate. All experiments involving Si substrates include the growth of 25 nm of Ge at 450° C., regardless of the temperature used for further deposition. This practice enhanced the growth rate when subsequent deposition occurs at higher temperatures. Prior to this, the Si substrates are either baked at 800° C. for 5 minutes or they are simply heated slowly to 450° C. while being exposed to a very low flux ($\approx 2\times 10^{14}$/cm$^2$-s) of the growth gas.

A high-temperature bake is standard for the preparation of a clean, reconstructed Si surface in ultra-high vacuum. In our vacuum, though, the rate of surface oxidation is probably so great that it is impossible to maintain a clean surface during the cooldown to 450° C. Moreover, it is not definite that a bake temperature of 800° C. is adequate to clean the surface in the presence of $\approx 3\times 10^{-7}$ Torr of water vapor. For these reasons, growth was initiated as the protective hydride was desorbed by introducing digermane during heating of the substrate.

For Ge substrates the in-situ preparation consists simply of a bake at 700° C. for 5 minutes. Because GeO desorbs from a Ge surface at temperatures above 600° C., this bake temperature is quite adequate to remove the predominant contaminants.

The chamber pressure is kept low in order to minimize scattering of the jet molecules by background gas. Accordingly, the pulsed valve is adjusted so that, with a reservoir pressure of 1250 torr and a repetition rate, RR, of 3 Hz, the time-averaged chamber pressure is nominally 0.5 mTorr. All experiments discussed here had a pulse duration, $T_p$, of $\approx 2.9$ msec.

To quantify the gas flow rate, at the end of each experiment a known number of pulses are released into the closed chamber and the pressure rise is recorded. From this measurement of the number of molecules released per pulse, $N_p \approx 6\times 10^{17}$, the time-averaged, $N_p\times RR$, and instantaneous, $N_p/T_p$, flow rates are obtained. Using the mentioned values for RR and $T_p$ they are found to be nominally $1.8\times 10^{18}$ molecules/sec and $2.1\times 10^{20}$ molecules/sec, respectively. For a 5% $Ge_2H_6$/95% He mixture, with m=3, and D=4.1 cm, the corresponding molecular fluences at the growth surface (for $\alpha=0$) are $\approx 3.6\times 10^{15}$/cm$^2$-s (time-averaged) and $\approx 4.0\times 10^{17}$/cm$^2$-s (instantaneous). Note that the nominal dose per 3 msec pulse is $1.2\times 10^{15}$/cm$^2$, equivalent to approximately two monolayer exposure for (100) Si or Ge surfaces.

The background gas flux on the growing surface also should be considered. The most useful gauge of this flux contribution is the dosage per pulse repetition period. The four experimental parameters that controlled this dosage were $N_p$, RR, the chamber volume, and the pumping time constant $\tau$. We have independently determined that $\tau=0.25$ sec, and the other necessary information has been given above. Using an effective (i.e., thermally and directionally averaged) digermane velocity of $1.3\times 10^4$ cm/sec, we calculate that $3\times 10^{15}$/cm$^2$ background molecules strike the surface between pulses. According to these estimates, then, only about 30% of the time-averaged flux on the growth surface was due to the jet. The instantaneous jet flux, though, was at least 30 times greater than the peak background flux.

These gas flow parameters were held fixed in order to study the growth rates as a function of substrate temperature. Slightly different tests were performed specifically to study the adsorption layer decomposition process(es). In these tests the repetition rate was optimized to allow full surface regeneration at each temperature.

A delay generator is used to trigger both the gathering of data by the computer and (a few milliseconds later) the opening of the pulsed valve. For each gas pulse, a reflectivity reading is made just prior to its arrival at the surface and another is made just as the pulse ended. In this manner a record of the pulse-induced reflectivity change as the film thickness increased was obtained. The temporal evolution of the reflectivity transient is recorded by monitoring the reflectivity throughout the course of the pulse/pumpout cycle.

A single pulse normally changes the sample reflectivity by $\approx 0.3\%$, which is approximately a factor of six above the background noise level. In investigation of the surface properties enough pulses are averaged in order to reduce the noise level to $\approx 5\%$ or less of the transient signal. However, the signal from a single pulse is sufficient for process control in practical application.

Figure 4:
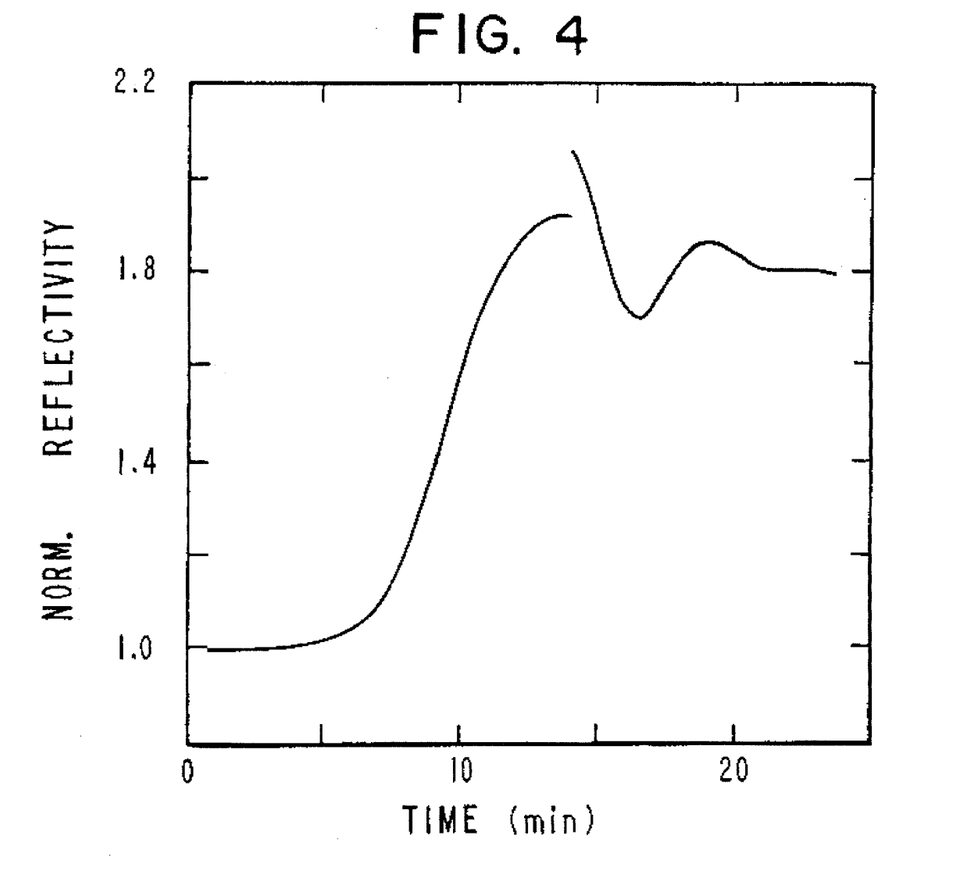
FIG. 4 is a graphical representation of reflectivity v. time for film thickness in heteroepitaxial growth.

After averaging and smoothing, we obtain signals such as that displayed in FIG. 2. Choosing the average value of the first few milliseconds (the prepulse reflectivity) as the baseline, $R_0$, and writing subsequent readings as R(t), we define the normalized differential reflectivity as $$\Delta R(t) = (R(t) - R_0)/R_0$$
$$R_0$$

and refer only to this quantity when discussing the transient signals. For heteroepitaxial growth the reference signal, $R_o$, varies slowly and is used to monitor the film thickness in-situ, as shown in FIG. 4.

CONCLUSION

While advantageous embodiments have been chosen to illustrate the invention, it will be understood by those skilled in the art that various changes and modifications can be made therein without departing from the scope of the invention as defined in the appended claims.

We claim:

1. An apparatus for the formation of thin film materials comprising:

means for delivering a pulse of material to a growth surface of a substrate to form an adsorption layer of said material on said growth surface;

means for monitoring available active sites on said growth surface; and means for controlling the delivery of said material according to the availability of active sites on said growth surface.

2. An apparatus for digital epitaxy comprising:

a chamber for processing and monitoring a substrate;

means for supplying a short gas pulse to form an adsorption layer on a growth surface of said substrate;

means for evacuating said gas pulse from said chamber;

means for generating and evaluating isothermal desorption spectra of said growth surface of said substrate to monitor the formation and evolution of said adsorption layer on said growth surface of said substrate.

3. An apparatus according to claim 2, wherein said means for supplying a short gas pulse includes a pulsed molecular beam valve.

4. An apparatus according to claim 3, wherein said pulsed molecular beam valve includes a linear translator for changing the distance between said pulsed molecular beam valve and said substrate.

5. An apparatus according to claim 2, wherein said means for evacuating includes a vacuum associated with said chamber.

6. An apparatus according to claim 2, wherein said means for evaluating comprises a laser applying a beam of light to said growth surface to produce a signal, a photodiode detecting said signal, and a microcomputer analyzing said signal.

7. An apparatus according to claim 2, further including means for heating said substrate to facilitate desorption of side products from said adsorption layer.

8. An apparatus according to claim 2, further including means for controlling the position of said substrate within said chamber.

* * * * *